(12) United States Patent
Patel

(10) Patent No.: US 10,917,110 B1
(45) Date of Patent: Feb. 9, 2021

(54) MULTIPLE SYMBOL DECODER

(71) Applicant: ATI Technologies ULC, Markham (CA)

(72) Inventor: Vinay Patel, Stouffville (CA)

(73) Assignee: ATI TECHNOLOGIES ULC, Markham (CA)

( * ) Notice: Subject to any disclaimer, the term of this patent is extended or adjusted under 35 U.S.C. 154(b) by 0 days.

(21) Appl. No.: 16/558,274

(22) Filed: Sep. 2, 2019

(51) Int. Cl.
*H03M 7/40* (2006.01)
*H03M 7/30* (2006.01)

(52) U.S. Cl.
CPC ....... *H03M 7/4093* (2013.01); *H03M 7/3084* (2013.01); *H03M 7/6005* (2013.01)

(58) Field of Classification Search
USPC .................................................... 341/65, 67
See application file for complete search history.

(56) References Cited

U.S. PATENT DOCUMENTS

| | | | | |
|---|---|---|---|---|
| 5,686,916 A * | 11/1997 | Bakhmutsky | ......... | H03M 7/425 341/67 |
| 5,808,570 A * | 9/1998 | Bakhmutsky | ......... | H03M 7/425 341/106 |
| 6,043,765 A * | 3/2000 | Twardowski | ....... | H03M 7/4081 341/65 |
| 9,819,359 B1 * | 11/2017 | Havlik | ................ | H03M 7/4037 |
| 9,906,239 B1 * | 2/2018 | Plumadore | .............. | H03M 7/40 |

* cited by examiner

*Primary Examiner* — Lam T Mai
(74) *Attorney, Agent, or Firm* — Park, Vaughan, Fleming & Dowler LLP

(57) ABSTRACT

An electronic device for decompressing compressed data includes a decoding subsystem having a symbol decoder and a second symbol resolver with a number of local symbol decoders and a symbol selector. The symbol decoder decodes a first symbol from a first code for which a symbol is available in a block of the compressed data and communicates a length of the code to the second symbol resolver. Each local symbol decoder, substantially in parallel with the decoding of the first symbol in the symbol decoder, decodes a respective symbol from a first code for which a symbol is available in a respective sub-block of the block of the compressed data. The second symbol resolver selects, as a second symbol, based on the length received from the symbol decoder, one of the respective symbols from the local symbol decoders. The decoding subsystem then provides the first and second symbols.

20 Claims, 4 Drawing Sheets

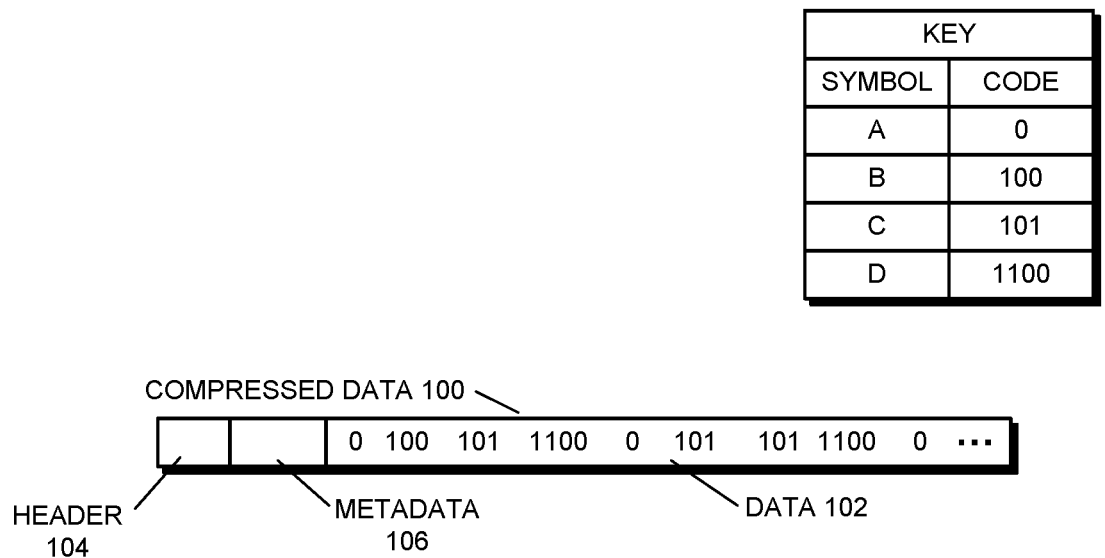
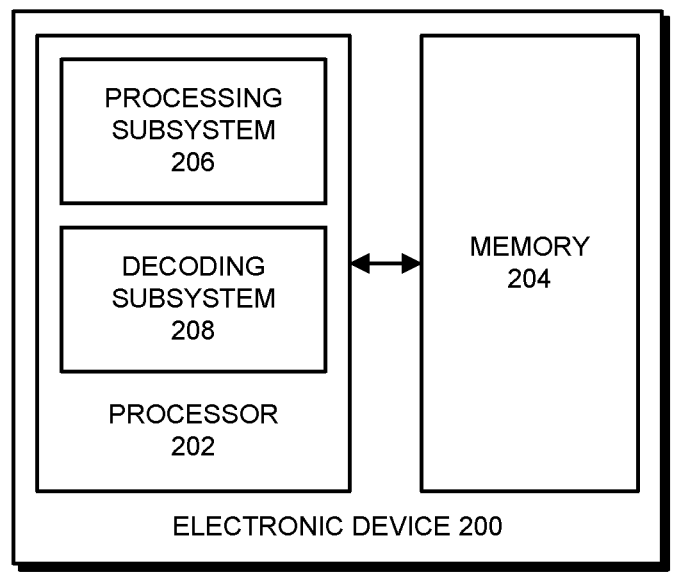
FIG. 1
FIG. 2

MULTIPLE SYMBOL DECODER

BACKGROUND

Related Art

Some electronic devices perform operations for compressing data such as user or system files, flows or sequences of data, etc. The electronic devices may compress data to reduce the size of the data to enable more efficient storage of the data in memories, transmission of the data between electronic devices via a network, etc. For example, electronic devices can use a coding standard such as a prefix coding standard (e.g., Huffman coding, Shannon-Fano coding, etc.) for encoding data when generating compressed data from original data.

Although compressing data can increase the efficiency of storing and handling data, compressed data must be decompressed before being used for many operations. This means that, before such operations can be performed, an electronic device must perform operations to reverse the effects of the compression operations—and thus to restore or recreate the original data. In many electronic devices, software (i.e., a software routine, an application program, etc.) is used for decompressing compressed data. Using software for decompressing compressed data typically requires a general-purpose processor such as a central processing unit (CPU) to perform a large number of decompression operations and associated memory accesses. Due to the large number of decompression operations and the memory accesses, using software for decompression is inefficient.

BRIEF DESCRIPTION OF THE FIGURES

FIG. 1 presents a block diagram illustrating compressed data in accordance with some embodiments.

FIG. 2 presents a block diagram illustrating an electronic device in accordance with some embodiments.

Throughout the figures and the description, like reference numerals refer to the same figure elements.

DETAILED DESCRIPTION

Figure 3:
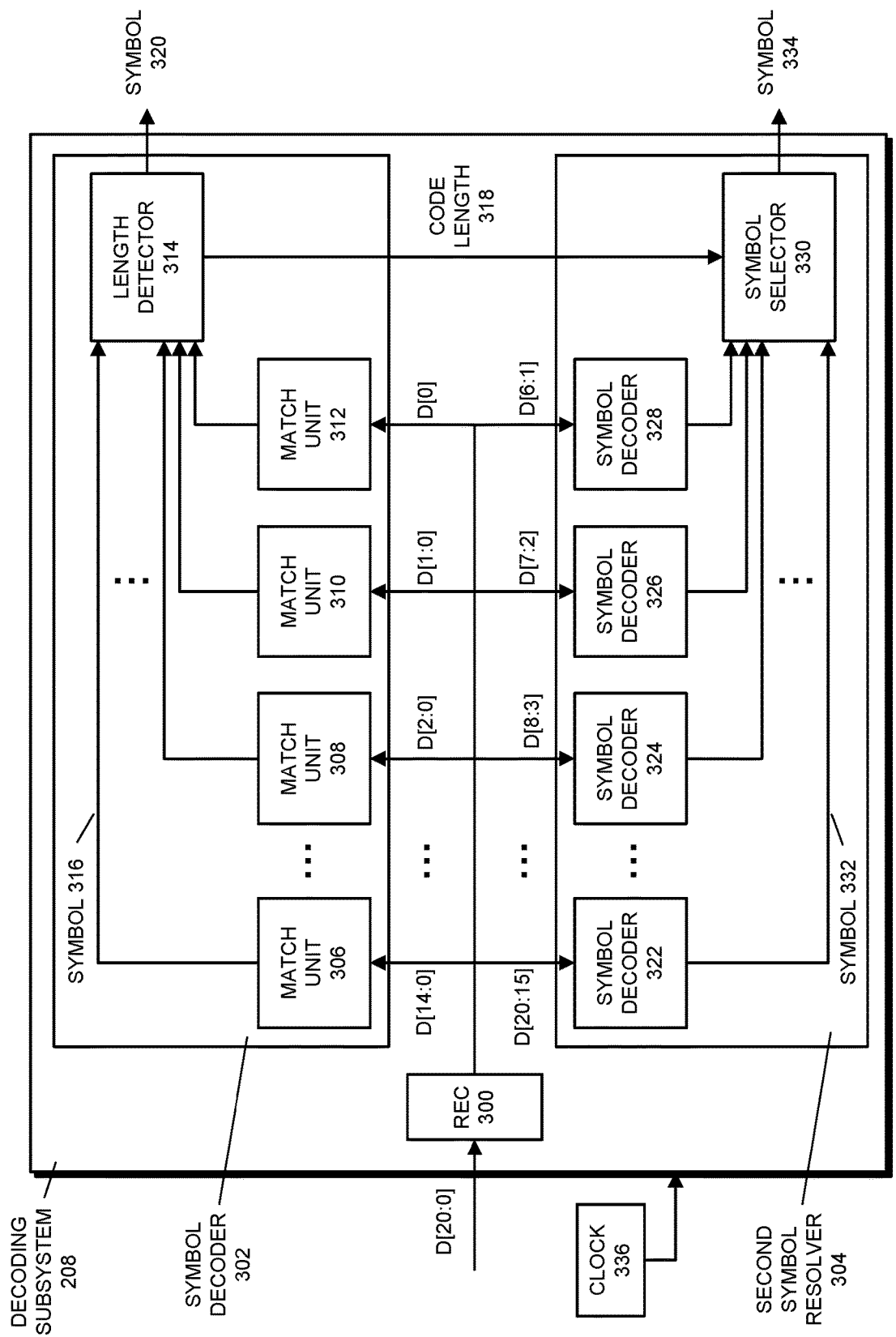
FIG. 3 presents a block diagram illustrating a decoding subsystem in accordance with some embodiments.

The following description is presented to enable any person skilled in the art to make and use the described embodiments and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that this term may have significant additional aspects that are not recited herein for clarity and brevity and thus the description is not intended to limit the term.

Functional block: functional block refers to a group, collection, and/or set of one or more interrelated circuit elements such as integrated circuit elements, discrete circuit elements, etc. The circuit elements are "interrelated" in that circuit elements share at least one property. For example, the interrelated circuit elements may be included in, fabricated on, or otherwise coupled to a particular integrated circuit chip or portion thereof, may be involved in the performance of given functions (computational or processing functions, memory functions, etc.), may be controlled by a common control element and/or a common clock, etc. A functional block can include any number of circuit elements, from a single circuit element (e.g., a single integrated circuit logic gate) to millions or billions of circuit elements (e.g., an integrated circuit memory).

Compressed Data

In the described embodiments, operations are performed on and using compressed data. Generally, compressed data is the output of one or more encoding and/or other operations on original data that result in at least some of the original data being replaced by data that can be used to recreate the original data and/or by other values. In the described embodiments, various types of data may be compressed, including user or system files (e.g., audio and/or video files, document files, executable files, operating system files, etc.), flows or sequences of data (e.g., audio and/or video data flows, sequences of data received via a network interface, etc.), data captured from sensors (e.g., cameras and/or microphones, thermometers, vibration sensors, etc.), etc. In the described embodiments, numerous coding standards, algorithms, or formats, or combinations thereof, can be used for compressing data, including prefix coding standards such as Huffman coding, Shannon-Fano coding, etc.

The terms "compressed data" and "compression" as used herein apply broadly to operations on original data that result in at least some of the original data being replaced by other data that can be used to recreate the original data. As described above, these operations include various coding standards, algorithms, or formats, or combinations thereof. These terms should therefore not be interpreted as being limited only to operations such as dictionary coding compression and/or other operations that may sometimes be regarded as "compression" operations.

FIG. 1 presents a block diagram illustrating compressed data in accordance with some embodiments. As can be seen in FIG. 1, compressed data 100, which can be or be included in a file, a flow or sequence of data, etc., includes data 102, header 104, and metadata 106. Data 102 includes a sequence of variable-length codes that represent and replace sequences of bits, or "symbols," from original data. For example, a symbol for the letter A in the original data, which can have an original bit sequence such as 01000001, may be represented and replaced by a code such as 0 in data 102. In other words, in places where the symbol A appeared in the original data, the symbol has been removed and replaced the code 0 in compressed data 100. Other symbols, such as B, C, and D, can be replaced by codes such as 100, 101, and 1100, respectively. In some embodiments, the codes in compressed data 100 can represent and replace symbols of longer lengths, including multi-bit symbols (e.g., multi-character, multi-word, etc.), such as "1600 Pennsylvania Avenue" or "the Toronto Raptors." In addition, in some embodiments, the codes are "prefix free," in that none of the codes, e.g., the code 0 for the symbol A, matches the initial digits of another code.

Header 104 includes information about compressed data 100 such as information describing the content, formatting, source electronic device, network routing values, and/or length of the compressed data, etc. Metadata 106 includes information such as information for generating or identifying a decoding reference for decoding compressed data 100 (e.g., a code table such as a Huffman table, etc.), information about types and arrangements of operations to be performed for decoding the compressed data, etc. In some embodiments, the decoding reference includes mappings from the variable-length codes to the symbols from the original data that are used for decoding data 102 during a decompression operation.

In some embodiments, during a compression operation, an electronic device generates compressed data (e.g., data 102) from original data by reading the original data, determining the symbols (i.e., bit sequences) present in the original data, and recording frequency counts of the symbols in the original data. The electronic device then generates a code table, tree, list, or other data structure using the symbols. For this operation, the electronic device determines—and typically optimizes—the use and/or placement of the symbols in the code table, tree, list, or other data structure so that symbols that occur more frequently in the original data are assigned shorter codes (i.e., codes having fewer bits) than symbols that occur less frequently. The electronic device then uses the code table, tree, list, or other data structure to compress the original data, i.e., uses codes from the code table, tree, list, or other data structure to replace corresponding symbols in the original data. Note that, in some cases, the code table, tree, or list is generated separately—and perhaps using different data and by a different/remote electronic device—and is simply acquired and used for compressing the original data by the electronic device.

In some embodiments, during a decompression operation for decompressing compressed data, a decoding reference (i.e., a table, tree, list, or other data structure) is first generated or acquired. For example, and as described above, the decoding reference can be generated based on or from information in metadata in the compressed data. As another example, a decoding reference (e.g., a generic decoding reference prepared in advance for compressed data, etc.) can be acquired from a memory, a network interface, or another entity. The decoding reference is then used to match codes in the compressed data with symbols so that the codes can be replaced by the symbols to recreate the original data. When matching the codes, the next code in the compressed data (i.e., the next sequence of bits in the compressed data that matches with a code from the decoding reference) is replaced by the associated symbol. In other words, a comparison is made between a first bit in the compressed data alone and a one-bit code from the decoding reference to see if there is a match. If there is a match, the first bit is replaced by the corresponding symbol. Otherwise, if there is not a match for the first bit alone, the combination of the first bit and the second bit are compared to two bit codes from the decoding reference to see if there is a match. If there is a match, the first bit and the second bit are replaced by a corresponding symbol. Otherwise, if there is not a match, the combination of the first, second, and third bit are compared to three bit codes in the decoding reference, and so on. In some embodiments, the comparisons are performed in parallel (e.g., in each of a set of matching units) and symbols associated with shortest matching codes are selected from among the matching codes.

Overview

In the described embodiments, an electronic device includes a decoding subsystem functional block that performs operations for decompressing compressed data. The decoding subsystem includes a symbol decoder functional block and a second symbol resolver functional block that perform operations for decoding, from blocks of the compressed data (e.g., N-bit blocks), up to two symbols at a time (e.g., per clock cycle, span of time, etc.). In the described embodiments, for a given block of the compressed data, the symbol decoder decodes a first symbol from the given block of the compressed data. The second symbol resolver, in parallel with the decoding in the symbol decoder, decodes respective symbols for a number of different sub-blocks of the given block of the compressed data. The second symbol resolver then selects one of the respective symbols as the second symbol based on a length of a code for the first symbol. In this way, the second symbol resolver speculatively decodes a number of symbols from the given block of the compressed data that may follow the first symbol and then selects one of the speculatively decoded symbols as the second symbol once the length of the code for the first symbol is known. The decoding subsystem then outputs the first symbol and the second symbol, e.g., stores the first symbol and the second symbol in memory, provides the first symbol and the second symbol to a consuming entity (e.g., a processing subsystem, etc.), etc.

During operation, the symbol decoder decodes a first symbol from a first code for which a symbol is available in a block of the compressed data. In other words, from a lowest bit in the block of the compressed data, the symbol decoder compares values of the bit(s) with codes from a decoding reference (e.g., a code table, list, or other data structure) to determine if there is a match between the codes and the bit(s)—and returns a symbol associated with the code when a match is found. For the comparing, the symbol decoder includes a set of match units, each of which is a functional block that matches codes of a specified length (e.g., 1 bit, 2 bits, etc.) to bits in the block of the compressed data and returns a symbol when a match is found.

In addition, during operation, the second symbol resolver, in each of a set of local symbol decoders, substantially in parallel with decoding the first symbol in the symbol decoder, decodes a respective symbol from a first code for which a symbol is available in a respective sub-block of the block of the compressed data. For this operation, each local symbol decoder is provided with a different set of bits of the block of the compressed data (i.e., a different sequence of neighboring bits from among multiple bits in the block of the compressed data) and decodes the respective symbol therefrom. For example, in some embodiments, assuming that there are 1 bit codes, 2 bit codes, 3 bit codes, etc., a sub-block for one of the local symbol decoders includes bits other than a first bit of the block of the compressed data, another of the sub-blocks includes bits other than the first two bits of the block of the compressed data, and so on. In this way, the second symbol resolver speculatively decodes a separate symbol for each of a set of codes that may follow the code for the first symbol decoded in the symbol decoder. Upon decoding the first symbol, the symbol decoder communicates, to the second symbol resolver, a length of the code from which the first symbol was decoded. A symbol selector in the second symbol resolver then selects, as a second symbol, based on the length received from the symbol decoder, one of the respective symbols from the local symbol decoders. The second symbol resolver next provides the second symbol to be output from the decoding subsystem.

In some embodiments, a receiver functional block receives compressed data and provides, to the symbol decoder and second symbol resolver the block of the compressed data and sub-blocks of compressed data, respectively. For example, the receiver may receive the compressed data from a file, from a stream of data (via a network interface, an input-output (TO) device, etc.), from a sensor such as a camera or microphone, etc. After an initial/first block of the compressed data, which starts at a first location, address, etc. in the compressed data, the receiver determines a next block of the compressed data and sub-blocks of the compressed data based on lengths of the codes decoded in the symbol decoder and the second symbol resolver. For example, assuming that the symbol decoder and second symbol resolver each decode a symbol per cycle of a controlling clock and that blocks of compressed data are 21 bits in length, if the symbol decoder decodes a 3-bit code and the second symbol resolver decodes a 5-bit code from a first block of the compressed data in a first clock cycle, the receiver shifts in 8 new bits from the compressed data to append to the remaining 13 bits from the first block of the compressed data and provides the resulting second block of the compressed data and sub-blocks thereof to the symbol decoder and second symbol resolver in the second clock cycle.

In some embodiments, one or both of the symbol decoder and the second symbol resolver use respective maximum code lengths. For example, in some embodiments, the symbol decoder uses a maximum code length of the coding standard used for compressing the data (e.g., 15 bits, 12 bits, etc.) and the second symbol resolver uses a maximum code length selected by a system designer or another entity (e.g., 6 bits, 8 bits, etc.). For instance, the maximum code length for the second symbol resolver may be selected in consideration of a balance in the physical size (e.g., semiconductor layout area), electrical power consumption, heat generated, etc. of the second symbol resolver with a performance (e.g., average rate of symbol decoding) of the decoding subsystem. In these embodiments, in cases where second symbols are associated with codes that are longer than the maximum code length for the second symbol resolver, the second symbol resolver may not decode a symbol in every clock cycle—and thus will output a specified value (e.g., null) or output nothing. In such cases, although the code is too long for the second symbol resolver to decode, the symbol decoder decodes the code that was originally too long for the second symbol resolver in a subsequent clock cycle (or other time period) (i.e., as the receiver shifts in new compressed data to generate a block of the compressed data for the clock cycle).

In some embodiments, the decoding subsystem includes at least one additional symbol resolver functional block that performs operations for decoding an additional symbol—e.g., a third symbol, etc.—in addition to the first and second symbols decoded by the symbol decoder and second symbol resolver. In these embodiments, each additional symbol resolver, substantially in parallel with the above-described operations of the symbol decoder and the second symbol resolver, decodes symbols from additional sub-blocks of the block of the compressed data. The symbol decoder and the second symbol resolver forward length information about codes decoded therein to the additional symbol resolver so that the additional symbol resolver can provide an appropriate symbol. For example, and continuing the example of a 21 bit block of the compressed data, if the symbol decoder decodes a symbol from a code of 8 bits and the second symbol resolver decodes a symbol from a code of 7 bits, the additional symbol decoder outputs a symbol from a code of up to a maximum code length (e.g., 6 bits, 5 bits, etc.) used by the additional symbol decoder following the 15th bit of the block of the compressed data. In these embodiments, the decoding subsystem can provide three or more symbols per cycle.

By using the hardware decoding subsystem with the symbol decoder functional block and second symbol resolver functional block (and possibly additional symbol resolver functional blocks) for decompressing compressed data, the described embodiments perform operations in hardware that existing devices perform using software. The decoding subsystem is faster and more efficient (e.g., requires less memory accesses, uses less electrical power, etc.) than using a software entity for performing the same operations. In addition, using the decoding subsystem frees other functional blocks (e.g., processing subsystems, etc.) in the electronic device to perform other operations. The decoding subsystem therefore improves the overall performance of the electronic device, which in turn improves user satisfaction.

Electronic Device

FIG. 2 presents a block diagram illustrating electronic device 200 in accordance with some embodiments. As can be seen in FIG. 2, electronic device 200 includes processor 202 and memory 204. Processor 202 is a functional block that performs computational, decompression, and other operations in electronic device 200. Processor 202 includes processing subsystem 206 and decoding subsystem 208. Processing subsystem 206 includes one or more functional blocks such as central processing unit (CPU) cores, graphics processing unit (GPU) cores, embedded processors, and/or application specific integrated circuits (ASICs) that perform general purpose computational, decompression, and other operations.

Decoding subsystem 208 is a functional block that performs operations for decompressing compressed input data. Generally, decoding subsystem 208 takes, as input, compressed input data that was generated based on original data and returns, as output, symbols for recreating the original data. Based on the arrangement of internal elements within decoding subsystem (e.g., a number of separate symbol resolvers within decoding subsystem 208), decoding subsystem 208 generates, from blocks of compressed data, up to a specified number of symbols per time period (e.g., two symbols per clock cycle, three symbols every 333 ps, etc.). Decoding subsystem 208 is described in more detail below.

Memory 204 is a functional block that performs operations of a memory (e.g., a main memory) in electronic device 200. Memory 204 includes memory circuits (i.e., storage elements, access elements, etc.) for storing data and instructions for use by functional blocks in electronic device 200, as well as control circuits for handling accesses (e.g., reads, writes, checks, deletes, invalidates, etc.) of data and instructions in the memory circuits. The memory circuits in memory 204 include computer-readable memory circuits such as fourth-generation double data rate synchronous dynamic random access memory (DDR4 SDRAM), static random access memory (SRAM), or a combination thereof.

Electronic device 200 is shown using particular numbers and arrangements of elements (e.g., functional blocks and devices such as processor 202, memory 204, etc.). Electronic device 200, however, is simplified for illustrative purposes. In some embodiments, a different number or arrangement of elements is present in electronic device 200. For example, electronic device 200 may include power subsystems, displays, etc. Generally, electronic device 200 includes sufficient elements to perform the operations herein described.

Although decoding subsystem 208 is shown in FIG. 2 as being included in processor 202, in some embodiments, decoding subsystem 208 is a separate and/or standalone functional block. For example, decoding subsystem 208 might be implemented (by itself or with supporting circuit elements and functional blocks) on a standalone integrated circuit chip, etc. Generally, in the described embodiments, decoding subsystem 208 is suitably situated in electronic device 200 to enable performing the operations herein described.

Electronic device 200 can be, or can be included in, any electronic device that performs data decompression or other operations. For example, electronic device 200 can be, or can be included in, electronic devices such as desktop computers, laptop computers, wearable electronic devices, tablet computers, smart phones, servers, artificial intelligence apparatuses, virtual or augmented reality equipment, network appliances, toys, audio-visual equipment, home appliances, controllers, vehicles, etc., and/or combinations thereof.

Decoding Subsystem

In the described embodiments, a decoding subsystem in an electronic device performs operations for decompressing compressed input data. FIG. 3 presents a block diagram illustrating decoding subsystem 208 in accordance with some embodiments. As can be seen in FIG. 3, decoding subsystem 208 includes receiver (REC) 300, symbol decoder 302, and second symbol resolver 304, each of which performs operations associated with decoding symbols from compressed data.

For the example in FIG. 3, symbol decoder 302 is assumed to decode symbols from codes for which a maximum length is 15 bits and second symbol resolver 304 is assumed to decode symbols from codes for which a maximum length is 6 bits. The 15 bit maximum length for symbol decoder 302 is an example of a longest permissible code in a coding standard. In other words, it is assumed that a rule or restriction for the coding standard used for creating compressed data to be decompressed by decoding subsystem 208 is that the longest allowable length for codes is 15 bits. The 6 bit maximum length for second symbol resolver 304 is an example of a configured (i.e., selected or chosen) upper limit on code lengths. Because longer code lengths require larger and more complex circuits for decoding, the upper limit on code length is selected, e.g., by a designer or other entity, in order to help balance circuit area and decoding effort (e.g., electrical power consumption, heat generated, etc.) required for second symbol resolver 304 against the overall symbol decoding rate of decoding subsystem 208. The example maximum code lengths for symbol decoder 302 and second symbol resolver 304 in FIG. 3 are not required, however; in some embodiments, the maximum code lengths are different (i.e., longer and/or shorter). Generally, the described embodiments are operable with any code lengths for which the operations described herein can be performed. In addition, for the example in FIG. 3, the N-bit blocks of the compressed data are 21 bits in length. The 21 bit length is used because symbol decoder 302 can decode codes up to 15 bits in length and second symbol resolver 304 can decode codes up to 6 bits in length for a maximum combined code length of 21 bits per clock cycle (or other period of time).

Receiver 300 in decoding subsystem 208 is a functional block that performs operations for receiving compressed data from another entity (e.g., processing subsystem 206, memory 204, etc.) and forwarding or directing portions of the compressed data to symbol decoder 302 and second symbol resolver 304. For example, in some embodiments, for each cycle of a controlling clock provided to decoding subsystem 208 by the clock 336 functional block (or other period of time), receiver 300 acquires a next 21 bit block from a stream or sequence of the compressed data and provides corresponding portions of the block of the compressed data to symbol decoder 302 and second symbol resolver 304.

In some embodiments, for an initial block of the compressed data, receiver 300 simply acquires the first 21 bits of the compressed data. For blocks of the compressed data after the initial block, receiver 300 generates each next block of the compressed data based on the lengths of codes decoded by each of symbol decoder 302 and second symbol resolver 304 in a current block of the compressed data. For generating a next block of the compressed data, receiver 300 receives, from one or both of symbol decoder 302 and second symbol resolver 304, information about the length of codes from which symbols were decoded in the current block of the compressed data. Receiver 300 then uses the information about the length of the codes to determine how many new bits are to be acquired from the compressed input data to generate the next block of the compressed data. In some cases, the combined length of decoded codes is shorter than the current block of the compressed data—and thus not all bits were decoded in the current block of the compressed data. Receiver 300 therefore acquires bits from the compressed input data to add to the remaining bits from the current block of the compressed data (i.e., that were not decoded) to create a next 21 bit block of the compressed data. For example, if symbol decoder 302 decoded a symbol from a 2-bit code and second symbol resolver 304 decoded a symbol from a 5-bit code in a current block of the compressed data, and thus 7 bits of the 21 bit current block of the compressed data were decoded, receiver 300 adds, or shifts in, 7 bits of new data from the compressed input data to the 14 remaining bits of the current 21 bit block of the compressed data to generate a next 21 bit block of the compressed data. Receiver 300 then provides corresponding portions of the next 21 bit block of the compressed data to symbol decoder 302 and second symbol resolver 304 to be decoded.

The "portions" of blocks of the compressed input data sent by receiver 300 to each of symbol decoder 302 and second symbol resolver 304 are groups or sets of the bits from the blocks of the compressed data to be decoded in functional blocks within symbol decoder 302 and second symbol resolver 304. Continuing the example, in some embodiments, receiver 300 sends 15 bit portions to symbol decoder 302 (i.e., bits 0-14 of blocks of the compressed input data) and a 20 bit portions to second symbol resolver 304 (i.e., bits 1-20 of blocks of the compressed input data). In some embodiments, sending the portions of blocks of the compressed input data involves receiver 300 communicating particular bits to symbol decoder 302 and/or second symbol resolver 304, e.g., via dedicated serial or parallel signal lines or routes. Continuing the example, this means that receiver 300 communicates only bits 0-14 to symbol decoder 302 and only bits 1-20 to second symbol resolver 304. In some embodiments, however, sending the portions involves communicating full 21 bit blocks of the compressed data to symbol decoder 302 and second symbol resolver 304 on a serial or parallel communication bus, signal lines, or other communication route, from where the appropriate portions are read by each of symbol decoder 302 and second symbol resolver 304.

Symbol decoder 302 in decoding subsystem 208 is a functional block that performs operations for decoding individual symbols from blocks of compressed input data. Symbol decoder 302 includes a set of match units, i.e., match units 306-312, and length detector 314. Each match unit of match units 306-312 is a functional block that performs operations for comparing codes of respective lengths to bits of the block of the compressed data and returning corresponding symbols when a match is found (e.g., symbol 316 from match unit 306, etc.). For example, match unit 312 includes circuit elements (e.g., logic gates, comparison circuits, multiplexors, memory elements, etc.) for comparing a single bit code to the first bit of the block of the compressed data (shown as D[0] in FIG. 3). In this way, match unit 312 determines if there is a match with the one bit code in the first bit of the block of the compressed data. When match unit 312 finds a match, match unit 312 outputs a symbol that is associated with the matching code to length detector 314. For example, match unit 312 may include memory elements that store a symbol and output circuit elements that output the symbol when a match is found. The other match units 306-310 perform similar operations, albeit for codes of other lengths. More specifically, match unit 306 finds matches between the first 15 bits of blocks of the compressed data and codes of 15 bits, match unit 308 finds matches between the first 3 bits of blocks of the compressed data and codes of 3 bits, and match unit 310 finds matches between the first 2 bits of blocks of the compressed data and codes of 2 bits, which are shown as D[14:0], D[2:0], and D[1:0], respectively, in FIG. 3. In some embodiments, every code length from 1-15 is processed in a separate match unit (as illustrated via the ellipses), although only a few of the match units are shown in FIG. 3 for clarity.

In some embodiments, due to rules and restrictions of the coding standard (e.g., a prefix coding standard) used to compress the compressed data, codes of every possible bit length may not exist simultaneously in compressed data. In these embodiments, only match units needed for comparing codes to bits from compressed data may be included in symbol decoder 302. Match units may not be found for every code length in symbol decoder 302 in these embodiments.

In some embodiments, match units 306-312 are configured, programmed, or otherwise set up for performing matches between codes and respective bits in blocks of compressed data and returning symbols based on found matches. In some of these embodiments, each match unit (or another entity that configures, programs, etc. that match unit) acquires codes and matching symbol information from a decoding reference (e.g., a table, list, or other data structure that includes code to symbol mapping information) and/or otherwise uses a decoding reference for configuring comparison circuits (e.g., logic gates, multiplexors, etc.) to return signals indicating whether a match has been found between codes of the corresponding length and bits of the blocks of compressed data. In addition, the symbol output circuit elements and memory elements are configured or programmed using the decoding reference to output symbols for associated codes.

Length detector 314 in symbol decoder 302 is a functional block that performs operations for determining a length of a code used to decode a symbol returned from a respective match unit 306-312 and communicating the length of the code to symbol selector 330 in second symbol resolver 304. For this operation, when a symbol is received from a match unit, length detector 314 determines a length of the code from which the symbol was decoded (e.g., using logic circuits, lookup circuits and memory elements, etc.) and provides code length 318 to symbol selector 330. For example, if match unit 312, which compares a 1 bit code to a first bit position in blocks of compressed data, returns a symbol, length detector 314 determines that a 1 bit code was decoded and returns a value of 1 (or another representative value) as code length 318. In some embodiments, because no match was found therein, match units 306-310 provide a signal indicating that no match was found, e.g., a null signal, a zero value, etc. In addition to outputting code length 318, length detector 314 forwards or otherwise passes through the received symbol to be output as symbol 320 from decoding subsystem 208.

Second symbol resolver 304 in decoding subsystem 208 is a functional block that speculatively decodes a number of symbols from respective sub-blocks of the block of the compressed data and provides one of the symbols to be output from decoding subsystem 208 based on the length of the code used to decode a symbol in symbol decoder 302. In other words, second symbol resolver 304 decodes, substantially in parallel with the decoding of a symbol in symbol decoder 302, a set of symbols from bits of the block of the compressed data that follow each set of bits of the block of the compressed data decoded in symbol decoder 302. From the set of symbols, a symbol is selected as output as a second symbol from decoding subsystem 208 based on the length of the code from which a first symbol was decoded in symbol decoder 302. For example, match unit 312 decodes the first bit of the block of the compressed data, i.e., bit 0 of the block of the compressed data, and thus second symbol resolver 304 decodes a symbol from bits 1-6 of the block of the compressed data in order to prepare for outputting that symbol as the second symbol in the event that match unit 312 finds a match and outputs the first symbol.

Second symbol resolver 304 includes a set of separate symbol decoders, i.e., symbol decoders 322-328, and symbol selector 330. Each of symbol decoders 322-328 is a separate functional block that performs operations similar to those of symbol decoder 302, i.e., for comparing codes of respective lengths to bits of the block of the compressed data and returning corresponding symbols when a match is found (e.g., symbol 332 from symbol decoder 322). In some embodiments, the internal elements of each of symbol decoder 322-328 are similar to those shown in symbol decoder 302 and described above (and are not again described for clarity and brevity), although adjusted for the number of bits in each sub-block of the block of the compressed data. The respective sub-block decoded in each symbol decoder of symbol decoders 322-328 includes a different sequence of neighboring bits from among the multiple bits in the block of the compressed data. For the example in FIG. 3, the sub-block decoded in symbol decoders 322-328 include bits 15-20, 8-3, 7-2, and 6-1, which are shown in FIG. 3 as D[20:15], D[8:3], D[7:2], and D[6:1], respectively. As described above, a length of each sub-block of the block of the compressed data is selected in order to decode a symbol that may follow a symbol decoded by symbol decoder 302.

Symbol selector 330 is a functional block that performs operations for selecting, from among symbols output by each of symbol decoders 322-328, a symbol to be output as a second symbol from decoding subsystem 208, i.e., as symbol 334. Symbol selector 330 includes circuit elements (e.g., logic circuits, demultiplexors, etc.) that receive code length 318 from length detector 314 and, based on a value of code length 318, select a symbol from among the symbols output by symbol decoders 322-328 to be output as symbol 334. For example, if match unit 306 decodes the symbol from bits 0-14 of the block of the compressed data, and thus code length 318 is 15 bits, then symbol selector 330 selects symbol 332 from symbol decoder 322, which decodes bits 15-20 of the block of the compressed data, to be output as symbol 334.

Note that, in some embodiments, because second symbol resolver 304 is limited to decoding 6 bit sub-blocks, it is possible that some or all of symbol decoders 322-328 are unable to decode a symbol, i.e., lack sufficient bits to decode a symbol. When a symbol cannot be decoded in a given symbol decoder in second symbol resolver 304, the given symbol decoder outputs a default value such as null, zero, or another value (or nothing). If the symbol that follows symbol 320 decoded in symbol decoder 302 is unavailable for this reason (i.e., could not be decoded due to the length of the code), symbol selector 330 does not output symbol 334—and decoding subsystem 208 decodes only one symbol for that clock cycle (or other period of time).

Although various internal elements are shown in decoding subsystem 208, symbol decoder 302, and second symbol resolver 304 in FIG. 3, the described embodiments are not limited to the illustrated arrangement or number of internal elements. Generally, decoding subsystem 208 includes sufficient elements to perform the operations described herein.

Additional Symbol Resolvers

Figure 4:
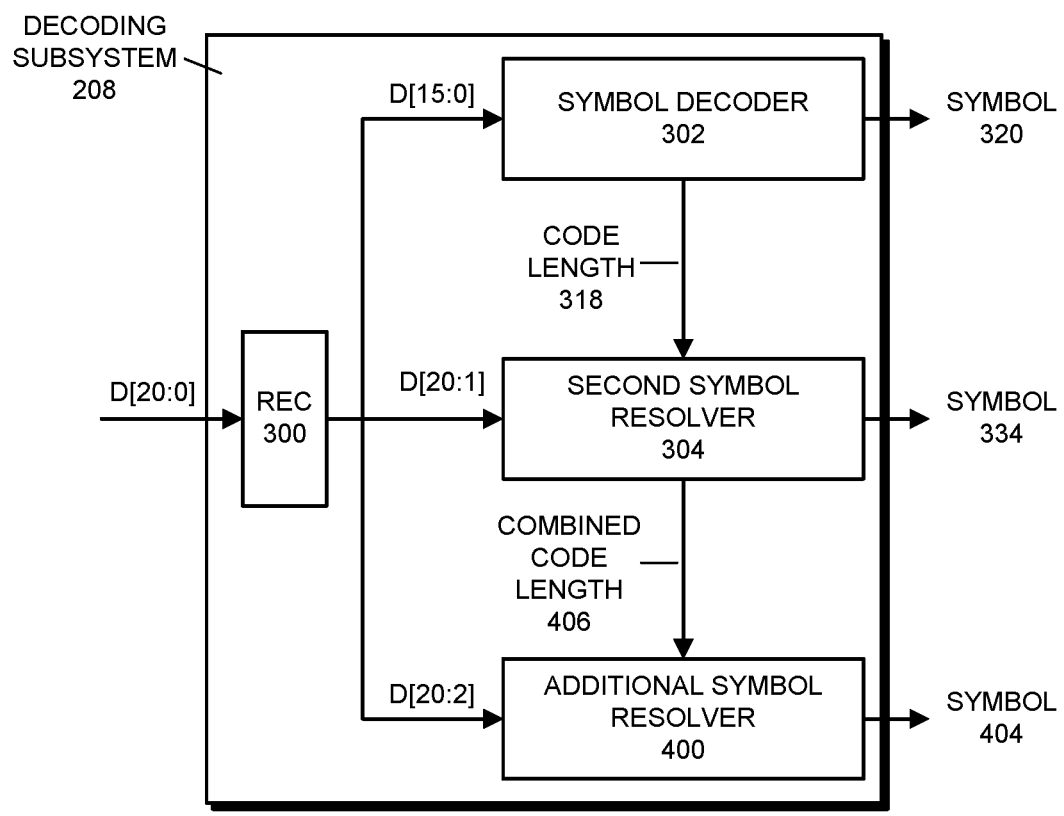
FIG. 4 presents a block diagram illustrating an additional symbol resolver in a decoding subsystem in accordance with some embodiments.

Although FIG. 3 shows only a single second symbol resolver (i.e., second symbol resolver 304) in decoding subsystem 208, in some embodiments, decoding subsystem 208 includes two or more symbol resolvers. FIG. 4 presents a block diagram illustrating an additional symbol resolver in decoding subsystem 208 in accordance with some embodiments. As can be seen in FIG. 4, decoding subsystem 208 includes symbol decoder 302 and second symbol resolver 304, which output symbol 320 and symbol 334, respectively, and which are described above. In addition, decoding subsystem 208 includes additional symbol resolver 400, which outputs symbol 404, i.e., a third symbol, from decoding subsystem 208.

Additional symbol resolver 400 performs operations similar to those for second symbol resolver 304, although for different sub-blocks of the block of the compressed data. Generally, additional symbol resolver 400 is a functional block that speculatively decodes a number of symbols from respective sub-blocks of the block of the compressed data and provides one of the symbols to be output from decoding subsystem 208 based on the combined length of the codes used to decode symbols in both symbol decoder 302 and second symbol resolver 304. In other words, additional symbol resolver 400 decodes, substantially in parallel with the decoding of the symbol in symbol decoder 302, a set of symbols from bits of the block of the compressed data that follow each set of bits of the block of the compressed data decoded in second symbol resolver 304. From the set of symbols, a symbol is selected as output as a third symbol from decoding subsystem 208 based on the combined length of the codes decoded in symbol decoder 302 and second symbol resolver 304, which is communicated to additional symbol resolver 400 as combined code length 406. For example, if symbol decoder 302 decodes a symbol from a code of 2 bits (i.e., bits 1-0 of the block of the compressed data) and second symbol resolver 304 decodes a symbol from 5 bits (i.e., bits 6-2 of the block of the compressed data), additional symbol resolver 400 can output a code decoded from bits above bit 6 of the block of the compressed data (depending on a maximum code length in additional symbol resolver 400, etc.). As with second symbol resolver 304, in cases when no symbol is decoded by additional symbol resolver 400 due to codes being longer than the maximum code length for additional symbol resolver 400, additional symbol resolver 400 outputs no symbol.

Processes for Decoding Compressed Input Data

Figure 5:
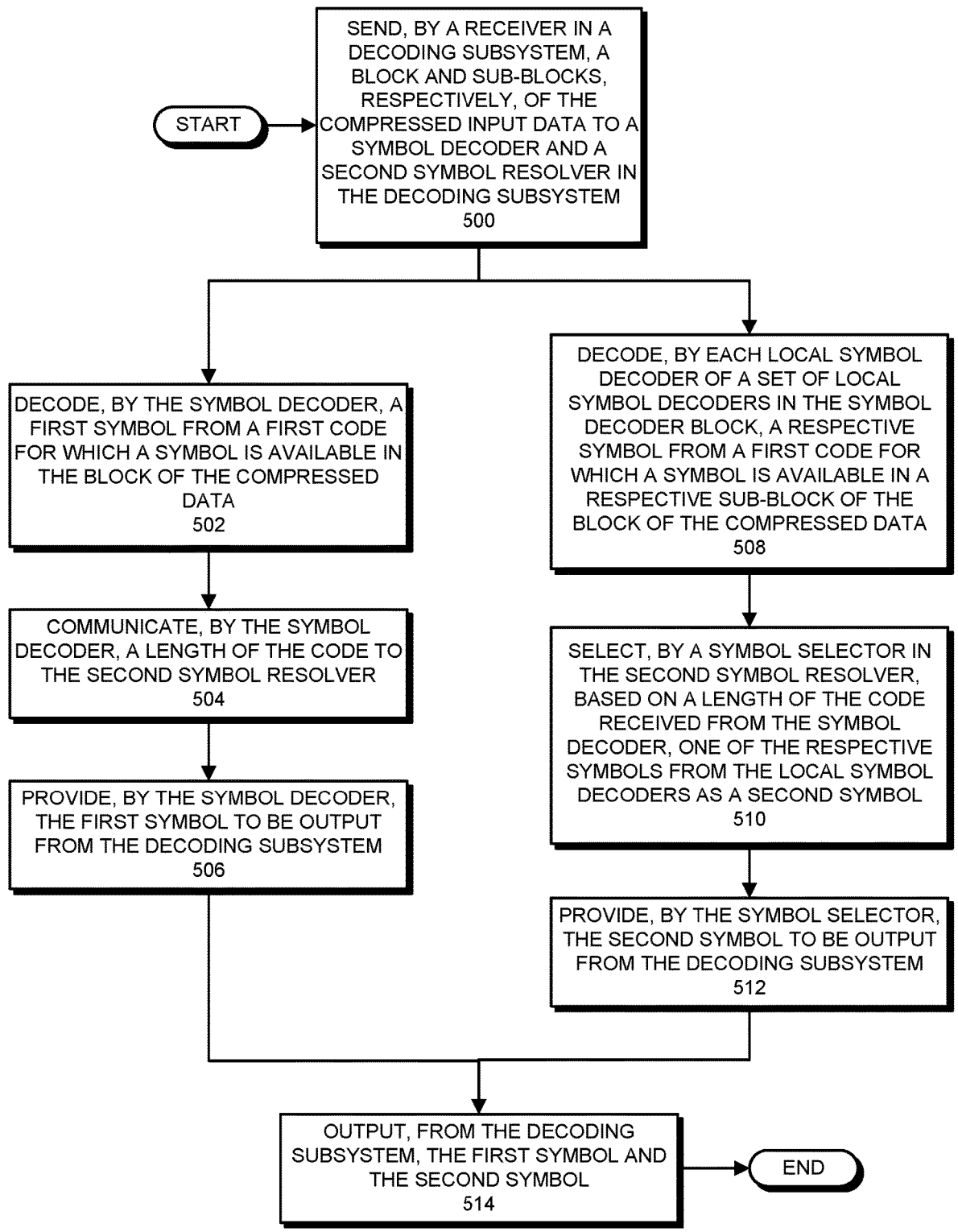
FIG. 5 presents a flowchart illustrating a process for decoding compressed input data in accordance with some embodiments.

In the described embodiments, a decoding subsystem (e.g., decoding subsystem 208) that includes a symbol decoder and a second symbol resolver (e.g., symbol decoder 302 and a second symbol resolver 304) performs operations for decoding compressed input data (e.g., compressed data 100). FIG. 5 presents a flowchart illustrating a process for decoding compressed input data in accordance with some embodiments. Note that the operations shown in FIG. 5 are presented as a general example of operations performed by some embodiments. The operations performed by other embodiments include different operations, operations that are performed in a different order, and/or operations that are performed by different entities or functional blocks.

For the process shown in FIG. 5, it is assumed that the decoding subsystem is receiving compressed input data from a source such as a file, a stream of data, etc. In other words, the individual bits of the compressed input data are being received by the decoding subsystem and thus are available to be operated on by a receiver in the decoding subsystem (e.g., receiver 300). In some embodiments, the decoding subsystem simply (and possibly only) decodes compressed input data that is provided to the decoding subsystem by another entity (e.g., processing subsystem 206) to generate symbols for recreating original data from which the compressed input data was created. In some embodiments, however, the decoding subsystem includes functional blocks for retrieving data from memory and/or other locations or entities (e.g., the processing subsystem, network interfaces, IO devices, etc.) and/or for storing symbols for original data in memory and/or providing the symbols to other entities. In some of these embodiments, the decoding subsystem receives and processes, in a corresponding functional block, a command or another signal that causes the decoding subsystem to begin acquiring and processing the input data.

As can be seen in FIG. 5, the process starts when a receiver in the decoding subsystem sends a block and sub-blocks of the compressed input data, respectively, to the symbol decoder and the second symbol resolver in the decoding subsystem (step 500). The block of the compressed input data is an N-bit block of the compressed input data (i.e., a set/sequence of the next N available bits retrieved from the incoming compressed input data). As described above, the particular number of bits in the N-bit block depends on the maximum code lengths used in the symbol decoder and the second symbol resolver. For the example in FIG. 5, a 32 bit block of the compressed input data is assumed based on an assumed 20 bit maximum code length for the symbol decoder (which is equal to an assumed maximum code length for the coding standard) and an assumed 12 bit maximum code length for the second symbol resolver. Recall that using shorter maximum code lengths in the second symbol resolver avoids the need for a larger and more complex second symbol resolver and avoids the additional consumption of electrical power, thermal energy, etc. associated therewith—although there is no requirement for using a particular code length in the second symbol resolver.

The decoding subsystem then performs a number of operations to decode symbols based on codes in the block of the compressed input data. As can be seen in FIG. 5, steps 502-506 are performed in the symbol decoder substantially in parallel with steps 508-512 in the second symbol resolver. As used herein, "substantially in parallel" indicates that some or all of the operations, i.e., the group of steps 502-506 and the group of steps 508-512, are performed at approximately the same time. For example, in some embodiments, these operations are performed within a one or more clock cycles of a controlling clock (e.g., clock 336) via combinational logic and other circuit elements in the symbol decoder and second symbol resolver.

For the operations for decoding the symbols, the symbol decoder decodes a first symbol from a first code for which a symbol is available in the block of the compressed data (step 502). For this operation, each match unit of a set of match units in the symbol decoder (e.g., match units 306-312), compares codes of a respective specified length (e.g., 1 bit, 2 bits, . . . 19 bits, and 20 bits) to a set of bits from the 20-bit portion of the block of the compressed data. For example, a first match unit may compare bit 0 of the block of the compressed data (i.e., a first or lowest bit) to a 1-bit code, a second match unit may compare bits 0-1 of the block of the compressed data to a 2-bit code, a third match unit may compare bits 0-2 of the block of the compressed data to a 3-bit code, and so forth. A given match unit finds a match between the respective bits of the block of compressed input data and a code returns a corresponding symbol to a length detector in the symbol decoder (e.g., length detector 314). For example, and continuing the example shown in FIG. 1, if the code 100 appears in the first three bit positions of the block of the compressed data, a match unit that compares 3-bit codes returns the symbol B to the length detector. The length detector in the symbol decoder then communicates the length of the code from which the first symbol was decoded to the second symbol resolver (step 504) and provides the first symbol to be output from the decoding subsystem (step 506).

For the operations for decoding the symbols, each local symbol decoder of a set of local symbol decoders in the second symbol resolver (e.g., symbol decoders 322-328) decodes a respective symbol from a first code for which a symbol is available in a respective sub-block of the block of the compressed data (step 508). For this operation, a separate local symbol decoder in the second symbol resolver decodes a symbol for each sub-block that may follow a code for a first symbol found by the symbol decoder. For example, if the codes can be 1 bit, 2 bits, 3 bits, etc., a first local symbol decoder decodes a sub-block of 12 bits (the assumed maximum code length for the symbol decoders in the second symbol resolver) starting from a second bit of the block of the compressed data, i.e., bits 1-12 of the block of the compressed data, a second local symbol decoder decodes a sub-block of 12 bits starting from the third bit of the block of the compressed data, i.e., bits 2-13 of the block of the compressed data, and so forth. In this way, the second symbol resolver decodes a symbol to be used as the second symbol for each code length that may be found in the symbol decoder when decoding the first symbol. A symbol selector (e.g., symbol selector 330) in the second symbol resolver then selects, based on the length of the code received from the symbol decoder, one of the respective symbols from the local symbol decoders as the second symbol (step 510). For example, for this operation, when a 2 bit code was decoded in the symbol decoder, the symbol output from the second local symbol decoder in the second symbol resolver is selected by the symbol selector to be output as the second symbol. The symbol selector then provides the second symbol to be output from the decoding subsystem (step 512).

The decoding subsystem then outputs the first symbol and the second symbol (step 514). As described above, for this operation, the decoding subsystem may simply output the first symbol and the second symbol at outputs of the decoding subsystem at the end of the clock cycle (or other time period) in which the symbols were decoded. Another entity in the electronic device can read or otherwise acquire the output symbols for use in other operations (e.g., writing the recreated original data to memory, generation of streams of the original data, etc.).

In some embodiments, the sub-blocks decoded in the second symbol resolver are shorter than a maximum length of a code for the coding standard. For the example in FIG. 5, the sub-blocks are 12 bits, i.e., the configured (selected, chosen, etc.) maximum length for codes for the second symbol resolver, whereas the maximum code length for the coding standard is 20 bits. It is possible, therefore, that the bits in a given sub-block will not include a complete code (e.g., will include 12 bits of a 13, 14, 15, etc. bit code) and thus will not be able to be decoded to a symbol. In this case, the second symbol resolver does not output a symbol or outputs a specified value such as a null value, etc. The second symbol is therefore not output from the decoding subsystem. In addition, in some embodiments, not every code length is permissible and/or used in encoding the original data and thus these code lengths are not decoded. For example, in these embodiments, match units are not provided for these code lengths and/or match units are present in the decoding subsystem, but are disabled, powered down, or otherwise not used.

In some embodiments, at least one electronic device (e.g., electronic device 200) uses code and/or data stored on a non-transitory computer-readable storage medium to perform some or all of the operations herein described. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDR4 SDRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations herein described. For example, the hardware modules can include, but are not limited to, one or more processors/cores/central processing units (CPUs), application-specific integrated circuit (ASIC) chips, neural network processors or accelerators, field-programmable gate arrays (FPGAs), decompression engines, decoding subsystems, compute units, embedded processors, graphics processors (GPUs)/graphics cores, pipelines, accelerated processing units (APUs), functional blocks, controllers, accelerators, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., electronic device 200 or some portion thereof) is stored on a non-transitory computer-readable storage medium that includes a database or other data structure which can be read by an electronic device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, M, and X As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device for decompressing compressed data, comprising:
   a decoding subsystem that includes:
      a symbol decoder; and
      a second symbol resolver having a number of local symbol decoders and a symbol selector;
   the symbol decoder being configured to:
      decode a first symbol from a first code for which a symbol is available in a block of the compressed data;
      communicate a length of the first code to the symbol selector in the second symbol resolver; and
      provide the first symbol to be output from the decoding subsystem; and
   the second symbol resolver being configured to:
      in each local symbol decoder, substantially in parallel with decoding the first symbol in the symbol decoder, decode a respective symbol from a first code for which a symbol is available in a respective sub-block of the block of the compressed data;
      in the symbol selector, select, as a second symbol, based on the length received from the symbol decoder, one of the respective symbols from the local symbol decoders; and
      provide, by the symbol selector, the second symbol to be output from the decoding subsystem.

2. The electronic device of claim 1, wherein:
   the block of the compressed data includes multiple bits; and
   the respective sub-block of the block of the compressed data for each local symbol decoder includes a different sequence of neighboring bits from among the multiple bits in the block of the compressed data, the sequences of neighboring bits each including a specified number of bits.

3. The electronic device of claim 2, wherein the specified number of bits is set based on a maximum code length for the local symbol decoders.

4. The electronic device of claim 1, wherein:
   when there is no code for which a symbol is available in the respective sub-block of the block of the compressed data, each local symbol decoder decodes no respective symbol; and
   when all of the local symbol decoders decode no respective symbols, the symbol selector provides no second symbol to be output from the decoding subsystem.

5. The electronic device of claim 1, wherein each symbol decoder from among the symbol decoder and the local symbol decoders includes:
   one or more match units, each match unit comparing codes of a corresponding specified length to portions of compressed data of the corresponding specified length and, when a match is found, providing symbols associated with the codes of the specified length, wherein that symbol decoder includes a separate match unit for each corresponding specified length from one bit to a number of bits equal to a maximum code length for that symbol decoder.

6. The electronic device of claim 5, wherein the portions of the compressed data of the corresponding specified length include lower bit positions in the compressed data.

7. The electronic device of claim 5, wherein the decoding subsystem further includes:
   a receiver, the receiver receiving the compressed data and providing, to the symbol decoder and the second symbol resolver, the blocks and sub-blocks of the compressed data, respectively, for decoding therein;

wherein the receiver selects a next block and next sub-blocks of the compressed data based on lengths of codes found by the symbol decoder and the second symbol resolver in the block of the compressed data.

8. The electronic device of claim 1, wherein the electronic device further comprises:
a clock source that provides, to the symbol decoder and the second symbol resolver, a clock signal used for controlling a timing of the decoding of the first symbol and the respective symbols, wherein the decoding of the first symbol and the respective symbols occurs in a same one or more clock cycles.

9. The electronic device of claim 1, further comprising:
at least one additional symbol resolver having a number of additional local symbol decoders and an additional symbol selector, the at least one additional symbol resolver configured to:
in each additional local symbol decoder, substantially in parallel with decoding the first symbol in the symbol decoder, decode a respective symbol from a first code for which a symbol is available in a respective additional sub-block of the block of the compressed data;
in the additional symbol selector, select, as an additional symbol, based on a combined length of the codes in the symbol decoder and the symbol resolver, one of the respective symbols from the additional local symbol decoders; and
provide, by the additional symbol selector, the additional symbol to be output from the decoding subsystem.

10. The electronic device of claim 1, further comprising:
an entity that receives the first symbol and/or second symbol output from the decoding subsystem and uses the first symbol and/or second symbol for one or more subsequent operations.

11. A method for decompressing compressed data in an electronic device that includes a decoding subsystem that includes a symbol decoder and a second symbol resolver having a number of local symbol decoders and a symbol selector, the method comprising:
decoding, by the symbol decoder, a first symbol from a first code for which a symbol is available in a block of the compressed data;
communicating, by the symbol decoder, a length of the first code to the symbol selector in the second symbol resolver;
providing, by the symbol decoder, the first symbol to be output from the decoding subsystem;
decoding, by each local symbol decoder in the second symbol resolver, substantially in parallel with decoding the first symbol in the symbol decoder, a respective symbol from a first code for which a symbol is available in a respective sub-block of the block of the compressed data;
selecting, by the symbol selector in the second symbol resolver, as a second symbol, based on the length received from the symbol decoder, one of the respective symbols from the local symbol decoders; and
providing, by the symbol selector in the second symbol resolver, the second symbol to be output from the decoding subsystem.

12. The method of claim 11, wherein:
the block of the compressed data includes multiple bits; and
the respective sub-block of the block of the compressed data for each local symbol decoder includes a different sequence of neighboring bits from among the multiple bits in the block of the compressed data, the sequences of neighboring bits each including a specified number of bits.

13. The method of claim 12, wherein the specified number of bits is set based on a maximum code length for the local symbol decoders.

14. The method of claim 11, further comprising:
decoding, by each local symbol decoder in the second symbol resolver, no respective symbol when there is no code for which a symbol is available in the respective sub-block of the block of the compressed data; and
providing, by the symbol selector in the second symbol resolver, no second symbol to be output from the decoding subsystem when all of the local symbol decoders decode no respective symbols.

15. The method of claim 11, wherein:
each symbol decoder from among the symbol decoder and the local symbol decoders includes one or more match units, wherein that symbol decoder includes a separate match unit for each corresponding specified length from one bit to a number of bits equal to a maximum code length for that symbol decoder; and
the method further comprises:
comparing, by each match unit in that symbol decoder, codes of a corresponding specified length to portions of compressed data of the corresponding specified length and, when a match is found, providing symbols associated with the codes of the specified length.

16. The method of claim 15, wherein the portions of the compressed data of the corresponding specified length include lower bit positions in the compressed data.

17. The method of claim 15, wherein the decoding subsystem includes a receiver, and the method further comprises:
receiving, by the receiver, the compressed data and providing, to the symbol decoder and the second symbol resolver, the blocks and sub-blocks of the compressed data, respectively, for decoding therein; and
selecting, by the receiver, a next block and next sub-blocks of the compressed data based on lengths of codes found by the symbol decoder and the second symbol resolver in the block of the compressed data.

18. The method of claim 11, wherein:
the electronic device includes a clock source that provides, to the symbol decoder and the second symbol resolver, a clock signal used for controlling a timing of the decoding of the first symbol and the respective symbols; and
the method further comprises:
decoding the first symbol and the respective symbols in a same one or more clock cycles.

19. The method of claim 11, wherein:
the electronic device includes at least one additional symbol resolver having a number of additional local symbol decoders and an additional symbol selector; and
the method further comprises:
decoding, in each additional local symbol decoder in the additional symbol resolver, substantially in parallel with decoding the first symbol in the symbol decoder, a respective symbol from a first code for which a symbol is available in a respective additional sub-block of the block of the compressed data;

selecting, in the additional symbol selector in the additional symbol resolver, as an additional symbol, based on a combined length of the codes in the symbol decoder and the symbol resolver, one of the respective symbols from the additional local symbol decoders; and providing, by the additional symbol selector in the additional symbol resolver, the additional symbol to be output from the decoding subsystem.

20. The method of claim 11, further comprising:

receiving, by an entity in the electronic device, the first symbol and/or second symbol output from the decoding subsystem; and using, by the entity in the electronic device, the first symbol and/or second symbol for one or more subsequent operations.

* * * * *